(12) United States Patent
Greber

(10) Patent No.: US 7,367,552 B2
(45) Date of Patent: May 6, 2008

(54) CLAMPING APPARATUS

(75) Inventor: Erich Greber, Kriens (CH)

(73) Assignee: Erowa AG (CH)

( * ) Notice: Subject to any disclaimer, the term of this patent is extended or adjusted under 35 U.S.C. 154(b) by 193 days.

(21) Appl. No.: 10/973,508

(22) Filed: Oct. 26, 2004

(65) Prior Publication Data

US 2005/0098407 A1    May 12, 2005

(30) Foreign Application Priority Data

Nov. 6, 2003  (CH) .................................. 1905/03

(51) Int. Cl.
*B23Q 3/00*    (2006.01)
(52) U.S. Cl. ..................... 269/309; 269/310
(58) Field of Classification Search ............. 269/309, 269/20, 310
See application file for complete search history.

(56) References Cited

U.S. PATENT DOCUMENTS

| | | | |
|---|---|---|---|
| 3,880,267 A | | 4/1975 | Auble et al. |
| 4,534,546 A | * | 8/1985 | Cattani .................. 269/58 |
| 5,190,272 A | * | 3/1993 | Zika et al. ............. 269/309 |
| 6,145,824 A | * | 11/2000 | Stark ...................... 269/309 |
| 6,152,436 A | * | 11/2000 | Sonderegger et al. ...... 269/310 |
| 6,527,266 B1 | * | 3/2003 | Yonezawa et al. ........ 269/309 |
| 2006/0049569 A1 | * | 3/2006 | Yonezawa ............... 269/309 |

FOREIGN PATENT DOCUMENTS

| | | |
|---|---|---|
| DE | 337 933 C | 2/1921 |
| EP | 0 255 042 A | 2/1988 |
| EP | 0 897 776 A | 2/1999 |

* cited by examiner

Primary Examiner—Lee D Wilson
(74) Attorney, Agent, or Firm—Maginot, Moore & Beck

(57) ABSTRACT

The clamping apparatus comprises a first coupling element and a second coupling element that can be releasably attached thereto. The first coupling element is provided with four at least partially conical centering pins that are adapted to engage four grooves correspondingly arranged on the second coupling element. Both coupling elements have stop surfaces serving as Z references, cooperating upon clamping together the two coupling elements to determine the position of the second coupling element with regard to the first coupling element in Z-direction once they are clamped together. The centering pins are, in relation to the grooves, designed such that each centering pin rests only on one flank of the associated groove. Thus, a gap remains between the centering pin and the other flank of the groove. Out of the overall eight groove flanks of the four grooves, the centering pins rest on in each case two pairs of diametrically opposite flanks, while they do not rest on the two further pairs of oppositely located flanks.

20 Claims, 4 Drawing Sheets

CLAMPING APPARATUS

BACKGROUND OF THE INVENTION

The present invention refers to a clamping apparatus, comprising a first coupling element provided with at least three centering pins having at least partially conical shape and a second coupling element adapted to be releasably attached to said first coupling element. The second coupling element is provided with a number of grooves corresponding to the number of the centering pins provided on the first coupling element such that the centering pins provided on the first coupling element engage the grooves when the second coupling element is attached to the first coupling element.

The first and second coupling elements both are provided with Z reference stop surfaces adapted to cooperate such as to determine the position of the second coupling element with regard to the first coupling element in Z-direction when the second coupling element is attached to the first coupling element.

Such clamping apparatuses are preferably used for clamping a coupling element provided with a workpiece or with several work-pieces in a well-defined position in the machining area of a machine tool. The one coupling element provided with the workpiece is usually designated as workpiece carrier or pallet, while the other coupling element, fixed in the machining area of the machine tool, is usually designated as chuck.

In known clamping apparatuses, one of the coupling elements, i.e. the chuck, is provided with four centering pins, each comprising two conical lateral surfaces. The other coupling element, i.e. the workpiece carrier or pallet, is provided with four grooves, corresponding to the four-centering pins as far as position and shape is concerned. During the operation of clamping the workpiece carrier to the chuck, the centering pins engage the grooves and align the workpiece carrier with regard to the chuck in X- and Y-directions as well as with regard to its angular position around the Z-axis. A fundamental disadvantage of such known clamping apparatuses may be seen in the fact that the centering pins may jam or seize in the grooves upon clamping the workpiece carrier to the chuck.

PRIOR ART

The Patent document EP-A-0 255 042 discloses a clamping apparatus for attaching a workpiece or a tool to a machine tool. Essentially, the clamping apparatus comprises a chuck, an electrode holder as well as a tension bolt attachable to the electrode holder. The top side of the electrode holder is provided with four grooves, offset by 90° with regard to each other around the Z-axis. In each flank of each groove, an incision is cut to form a lip that is elastically resilient in Z-direction. Projecting from the bottom of the chuck are four ridges that correspond to the grooves of the electrode holder as far as position and shape is concerned. In the region of the corners of the chuck, four posts are provided, serving as Z-reference. Upon clamping the electrode holder to the chuck, the ridges of the chuck come into contact with the elastically resilient lips and bend these axially inwards in Z-direction until the posts, serving as Z-reference, rest on support surfaces provided at the top of the electrode holder, with the result that the Z-position of the electrode holder with regard to the chuck is determined. By means of the ridges resting on the resilient lips, the electrode holder is positioned with regard to the chuck in X- and Y-directions as well as regarding its angular position around the Z-axis.

U.S. Pat. No. 3,880,267 discloses a coupling device assembled from first and second clutch members which each have lug elements formed on a face thereof so that the lug elements of one clutch member can be brought into coupling contact with lug elements of the other clutch member to form a driving connection thereof. The lug elements of one clutch member are of a type in which individual lug elements are convexly curved lengthwise, with the lug elements of the other clutch member being of the type in which individual lug elements are concavely curved lengthwise. Further, there is a lengthwise mismatch between the convex and concave curvatures of the lug elements of the clutch members. The first clutch member has a characteristic of greater elasticity than the second clutch member. For relieving circumferential stresses which develop between contacting lug elements of the two clutch members when the clutch members are coupled together in a driving relationship and when one clutch member is expanding at a greater rate than the other clutch member, one or more gaps are provided in the face of the first clutch member for receiving thermal growth of lug elements carried adjacent to the gaps when the walls of the same lug elements are loaded against lug elements carried by the second clutch member. Such a clutch is not suitable for precisely clamping a pallet on a chuck, particularly also because the entire system is multiply over-determined. Moreover, the position of the one clutch portion with regard to the other clutch portion is not defined in Z-direction, i.e. in axial direction.

The document EP-A-0 897 776 discloses a coupling assembly to be used in a machine tool for mounting a work piece to be machined in a torsionally fixed manner. The assembly comprises a pallet adapted to hold the work piece to be machined and having guide channels and a pallet support, whereby the pallet is positioned on the pallet support. The pallet support comprises an alignment surface for aligning the pallet with regard to the pallet support. The alignment surface has a plurality of alignment cams comprising base portions and incisions disposed below the base portions. The incisions provide for a resilient yielding of the related alignment cams, whereby the cams are disposed such that two opposite cams cooperate with the guide channels. A plurality of rest heads is located substantially in the corners of the alignment surface. Further, there is provided a swiveling pallet, whereby the pallet support is operationally coupled to the swiveling pallet. The swiveling pallet comprises a support wall perpendicularly mounted to the pallet support means and a guide comprising a sliding surface having a dove-tailed shape and having incisions that provide for a resilient behavior of the guide.

Finally, the Patent document DE-C-337 933 discloses a clutch for coupling two shafts. For this purpose, one of the shafts is provided with a spur gear comprising a gear rim. The other shaft comprises a gear wheel provided with cylindrical bores. The cylindrical bores of the gear wheel are designed such that in each case two teeth of the spur gear engage one cylindrical bore of the gear wheel once the two shafts are coupled together. Such a clutch is not suitable at all for precisely clamping a pallet on a chuck, the more so as this system is multiply over-determined and the axial position of the spur gear with regard to the gear wheel is not well defined upon coupling.

OBJECTS OF THE INVENTION

It is an object of the present invention to provide a clamping apparatus, comprising a first coupling element provided with at least three centering pins and a second coupling element provided with grooves to be engaged by the centering pins and adapted to be releasably attached to said first coupling element, which is rigid and can transform high loads. It is a further object of the invention to provide a clamping apparatus of the kind mentioned above in which the danger is minimized that the centering pins are jammed or seized in the grooves they engage. A still further object of the invention is to provide a clamping apparatus of the kind mentioned above in which the second coupling element can be clamped to the first coupling element repeatedly with very high precision.

SUMMARY OF THE INVENTION

In order to meet these and other objects, the invention provides a clamping apparatus, comprising a first coupling element provided with at least three centering pins having at least partially conical shape and a second coupling element adapted to be releasably attached to said first coupling element. The second coupling element is provided with a number of grooves corresponding to the number of the centering pins provided on the first coupling element such that the centering pins provided on the first coupling element engage the grooves when the second coupling element is attached to the first coupling element.

The first and second coupling elements both are provided with Z reference stop surfaces adapted to cooperate such as to determine the position of the second coupling element with regard to the first coupling element in Z-direction when the second coupling element is attached to the first coupling element.

The centering pins provided on the first coupling element may have a width that is smaller than the width of the grooves provided on the second coupling element. Thereby, the arrangement of the centering pins on the first coupling element is such that each centering pin rests only on one of the two flanks of the associated groove, whereby a gap remains between the centering pin and the opposite flank of the associated nut once the second coupling element is attached to the first coupling element, whereby at least in a first groove the centering pin rests on that flank that faces a second groove adjacent to the first groove, while in the adjacent second groove the centering pin rests on that flank that faces the adjacent first groove such that the position of the second coupling element with regard to the first coupling element is defined in X- and Y-direction as well as with regard to its angular position.

Of course, it is also possible that at least in a first groove the centering pin rests on that flank that is remote from a second groove adjacent to the first groove, while in the adjacent second groove the centering pin rests on that flank that is remote from the adjacent first groove.

Due to the fact, that only one centering pin is associated to each groove and that the centering pin rests only on one flank of the groove, while a gap remains at the other side, the danger is minimized that the centering pins are jammed or seized in the grooves they engage. As a result of the further characteristics, that at least two centering pins engaging adjacent grooves rest on those flanks of these adjacent grooves which face each other or which are remote from each other, the position of the second coupling element with regard to the first coupling element is precisely determined in X- and Y-direction as well as regarding its angular position around the Z-axis and an over-determination is largely avoided, with the result that the second coupling element can be clamped to the first coupling element repeatedly with very high precision, even if the centering pins rest only on one of the flanks of their associated grooves.

BRIEF DESCRIPTION OF THE DRAWINGS

In the following, an embodiment of the clamping apparatus according to the invention will be further described, with reference to the accompanying drawings, in which.

DETAILED DESCRIPTION OF A PREFERRED EMBODIMENT

Figure 1B:
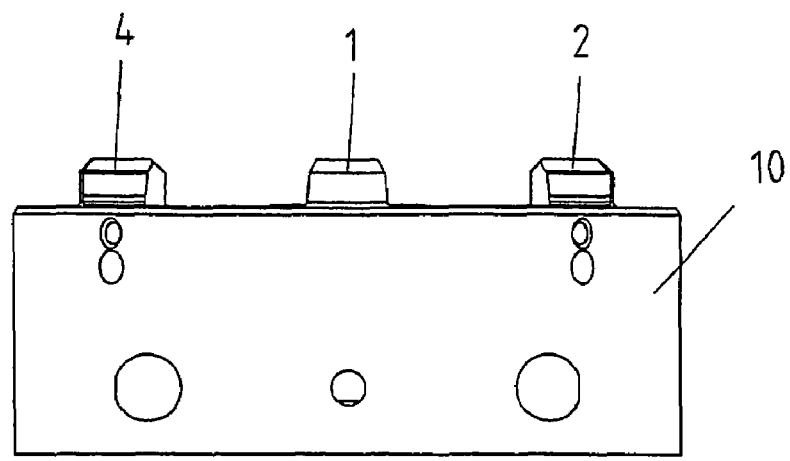
FIG. 1b shows a side view of the first coupling element.
Figure 1A:
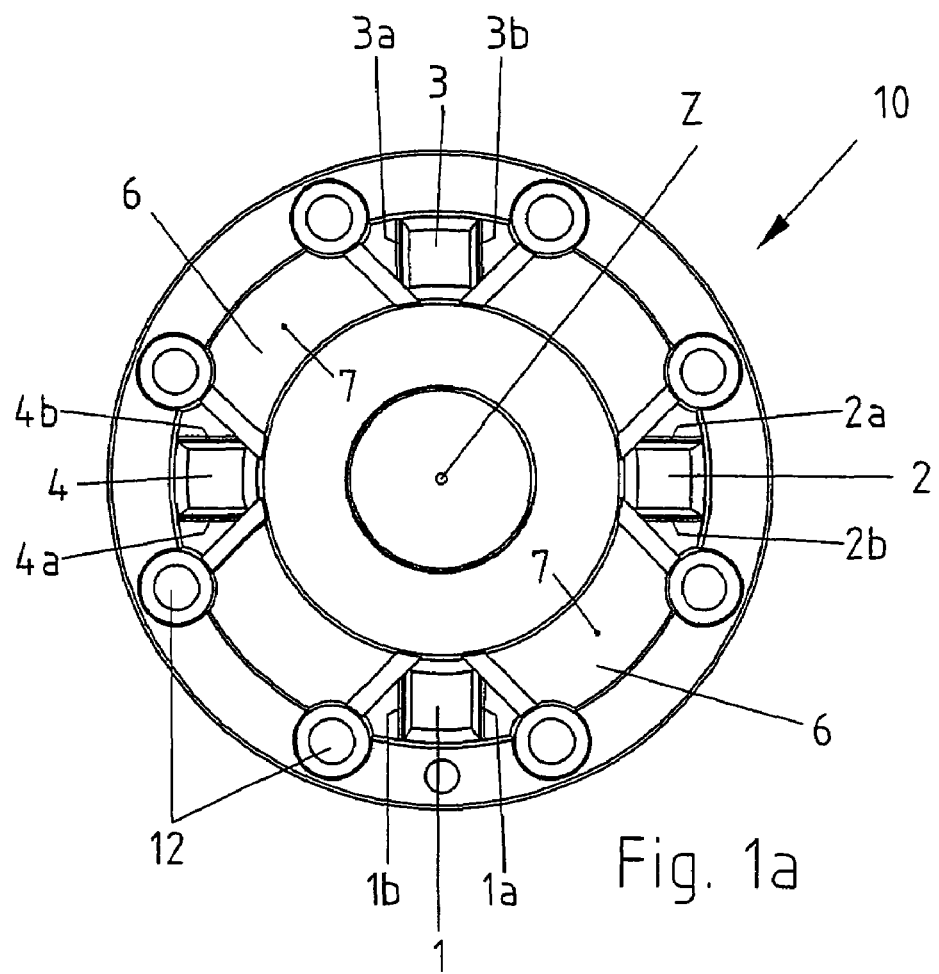
FIG. 1a shows a top view of the first coupling element.

FIG. 1a shows the first, essentially cylindrically shaped coupling element 10 in a top view, and FIG. 1b shows the first, essentially cylindrically shaped coupling element 10 in a side view. Usually, this first coupling element 10 is attached to a machine tool and serves as a clamping member for clamping a second coupling element 15 as shown in FIGS. 2a and 2b, adapted to receive a work piece, a machining tool or similar.

From the top of the first coupling element 10, four centering pins 1, 2, 3 and 4 project. With regard to the central axis Z, they are offset to each other by 90°. Each of these centering pins 1, 2, 3 and 4 comprises two conical side surfaces 1a, 1b, 2a, 2b, 3a, 3b, 4a, 4b.

Between two adjacent centering pins 1,2; 2,3; 3,4; 4,1 in each case a centering surface 6 is provided, serving as a Z-reference. In the center of the surfaces 6, there is provided an outlet 7 for blowing out air. For mounting the first coupling element 10, the latter one is provided with a plurality of mounting bores 12.

Figure 2B:
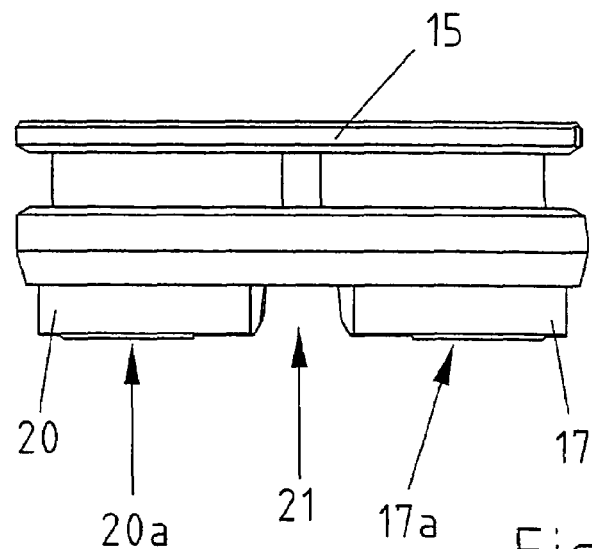
FIG. 2b shows a side view of the second coupling element.
Figure 2A:
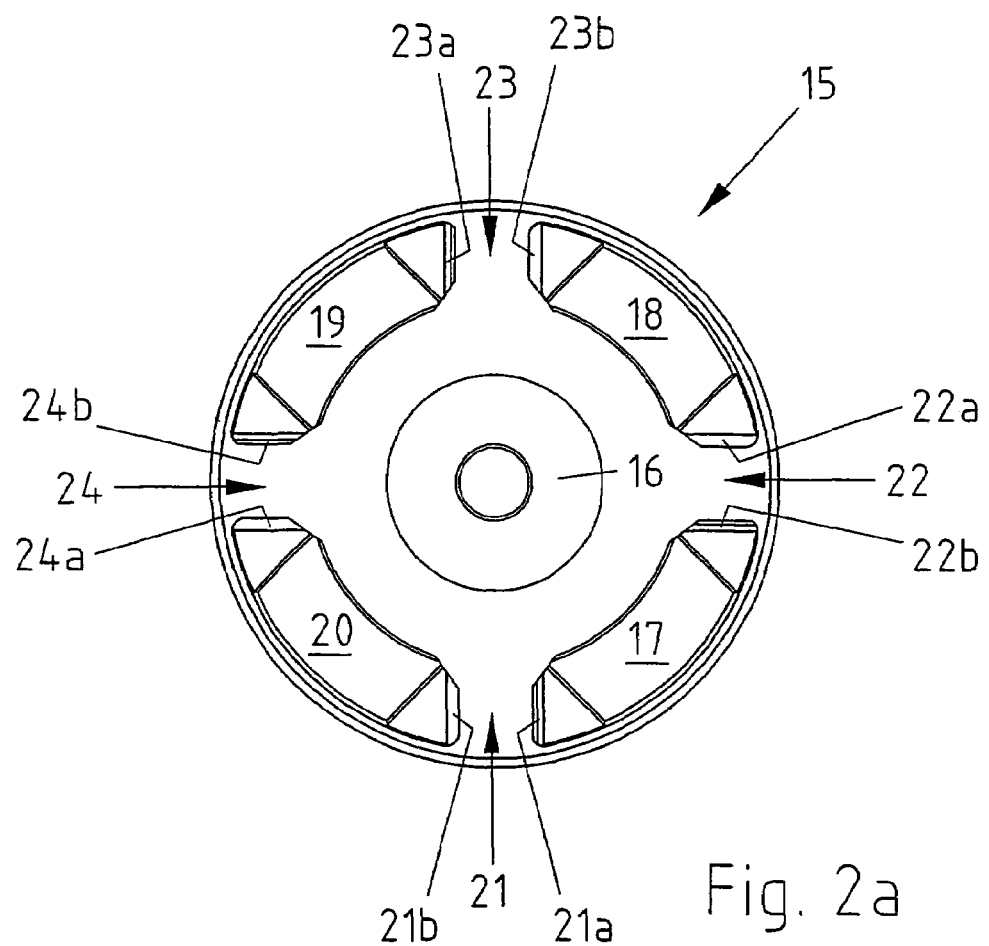
FIG. 2a shows a top view of the second coupling element.
Figure 4:
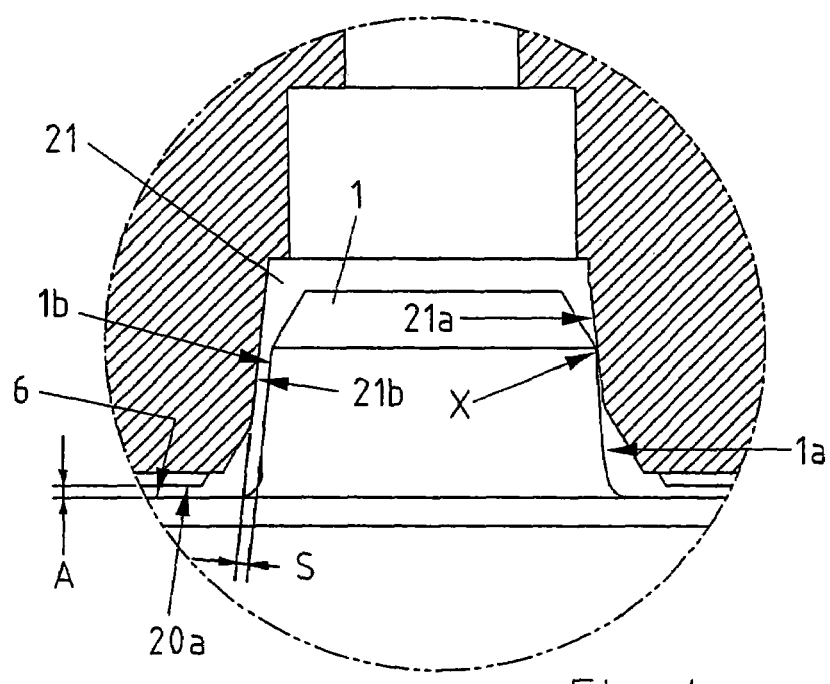
FIG. 4 shows an enlarged view of a portion of FIG. 3.

The second coupling element 15 shown in FIGS. 2a and 2b is adapted to receive a machining tool, a work piece or similar. Essentially, it is of similar general design having a cylindrical configuration as well and comprises a central recess 16 for receiving a clamping pin (not shown), by means of which it is connected to the first coupling element 10. Projecting from the bottom surface of the second coupling element 15, four sections 17, 18, 19, 20, in the shape of a segment of an annulus, are provided, the top surfaces of which having a reference surface 17a, 20a serving as a Z reference, as can bee seen particularly in FIG. 2b. This sections 17, 18, 19, 20 delimit four grooves 21, 22, 23, 24 which generally correspond to the centering pins of the first coupling element 10 as far as shape and position is concerned. The flanks 21a, 21b; 22a, 22b; 23a, 23b; 24a, 24b of the grooves 21, 22, 23, 24 run conically, whereby the upper region of the particular flank 21a, 21b; 22a, 22b; 23a, 23b; 24a, 24b is less inclined than the lower region of the particular flank 21a, 21b; 22a, 22b; 23a, 23b; 24a, 24b, as seen in FIG. 4.

It is understood that each groove 21, 22, 23, 24 has two flanks, namely 21a, 21b; 22a, 22b; 23a 23b and 24a, 24b.

Thereby, only one flank of each groove, i.e. the flank 21a of groove 21, the flank 22a of groove 22, the flank 23a of groove 23 and the flank 24a of groove 24 serves as a rest surface for the particular centering pin of the first coupling element, as will be explained in more detail herein after. Anyway, the angle of the flanks of the grooves is matched to the angle of the flanks of the centering pins.

Figure 3:
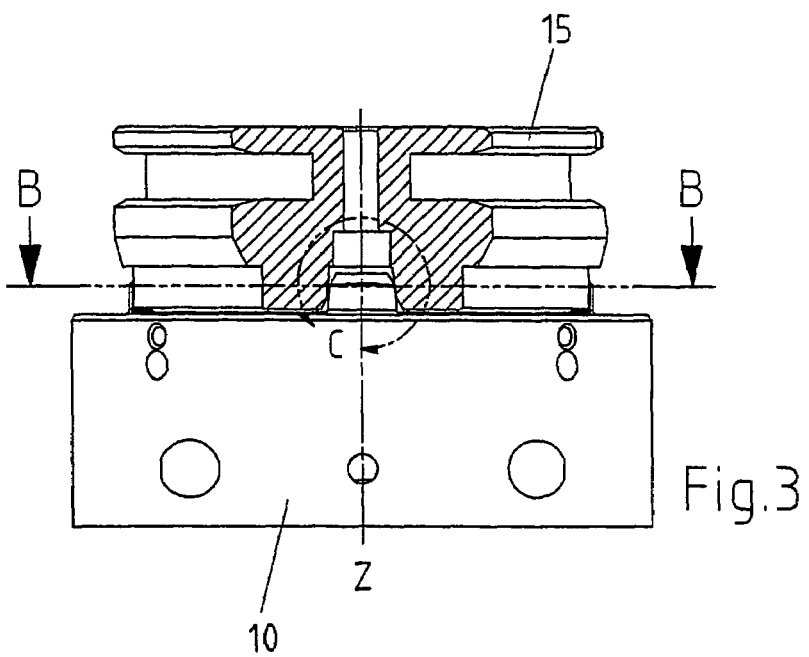
FIG. 3 shows a side view of the two coupling elements in an assembled state.

FIG. 3 shows a lateral view of the two coupling elements 10, 15 in a situation where they are coalesced, but are not yet clamped to each other. It should be noted, that the second coupling element 15 is shown in a partially sectional view. Coalesced means in that connection that the second coupling element 15 is lying on the first coupling element 10 without any clamping forces being exerted at all, in other words, the two coupling elements 10, 15 are not yet clamped towards each other.

In the above mentioned coalesced state, the second coupling element 15 is positioned with regard to the first coupling element not only both in X- and Y-directions, but also with regard to its angular position around the Z-axis Z. The only thing remaining is to determine the position in Z-direction. In order to clamp the second coupling element 15 to the first coupling element 10, and thereby to determine the Z-position of the second coupling element with regard to the first coupling element 10, as will be further explained herein after, the second coupling element 15 is pulled towards the first coupling element 10 by means of the afore mentioned tension bolt (not shown).

In the sectioned portion of FIG. 3, in representative manner, a centering pin engaging a groove of the second coupling element 15 is shown. This centering pin 1, engaging the groove 21 of the second coupling element 15, is shown in FIG. 4 in an enlarged view. This enlarged view of FIG. 4 shows that the centering pin 1 touches only one of the flanks of the groove, in other words, it touches only the right flank 21a of the groove, while a gap S remains between the centering pin 1 and the left flank 21b of the groove. Such a design can be realized in that, starting from a symmetrical groove and a symmetrical pin, respectively, either at one side of the groove or at one side of the pin some material is removed.

Anyway, the right flank 1a of the centering pin 1 rests on the right flank 21a of the groove 21. In the here shown state, without any clamping force acting, a gap A with a width in the region of a few thousands of an inch exists between the particular reference surface 20a of the second coupling element 15 and the Z reference stop surface 6 of the first coupling element 10. In the present example, the gap A is shown in an exaggerated width for clarity reasons. When the second coupling element 15 is clamped towards the first coupling element 10, this gap A is reduced to zero, using the elasticity of the material of the centering pin 1 and the elasticity of the material of the flank 21a of the groove 21.

During the clamping process, the second coupling element 15 is pulled against the first coupling element 10 in Z-direction to such an extent that the reference surfaces 20a of the second coupling element 15 rest on the Z reference stop surfaces 6 of the first coupling element 10; now the positioning of the second coupling element 15 with regard to the first coupling element 10 in Z-direction is accomplished, too. Due to the fact that the second coupling element 15 is moved during the clamping action in Z-direction with regard to the first coupling element 10 exclusively utilizing the elasticity of the material of the centering pins 1, 2, 3, 4 and the elasticity of the material of the flanks of the associated grooves 21, 22, 23, 24, after the two coupling elements 10, 15 having been coalesced and centered without any clamping force, it is not necessary to provide any means that are elastically resilient in Z-direction.

The size of the contact area, on which the respective centering pin 1, 2, 3, 4 rests on the associated groove flank, can be varied, according to the particular requirements. In case that extremely high torsion forces have to be transferred by the centering pins 1, 2, 3, 4, the above mentioned contact areas, of course, have to be chosen much larger than in the case that, for example, an extremely good self-cleaning effect has to be achieved. In order to achieve a good self-cleaning effect, the contact area between centering pin and groove flank should be as small as possible. In this connection it should be differentiated between line contact, area contact and positive fitting contact, whereby the difference between line contact and area contact, between area contact and positive fitting contact, and between line contact and positive fitting contact cannot be exactly defined, but is floating. In the present case, the two coupling elements 10, 15 not being clamped to each other, the front end of the conically designed lateral surface 1a of the centering pin 1 rests on the associated groove flank 21a along a line, i.e. establishes a line contact. To achieve this behavior, the angle of the conically designed lateral surface 1a of the centering pin 1, adapted to rest on the associated groove flank 21a, differs by 0,5% from the angle of the associated groove flank 21a. The region in which the centering pin 1 rests in a line contact on the associated groove flank 21a is designated by reference numeral X. This initial line contact changes after the clamping operation into an area contact due to the resilient deformation of the material of the centering pins 1, 2, 3, 4 and the resilient deformation of the material of the flanks of the associated grooves 21, 22, 23, 24.

Figure 5:
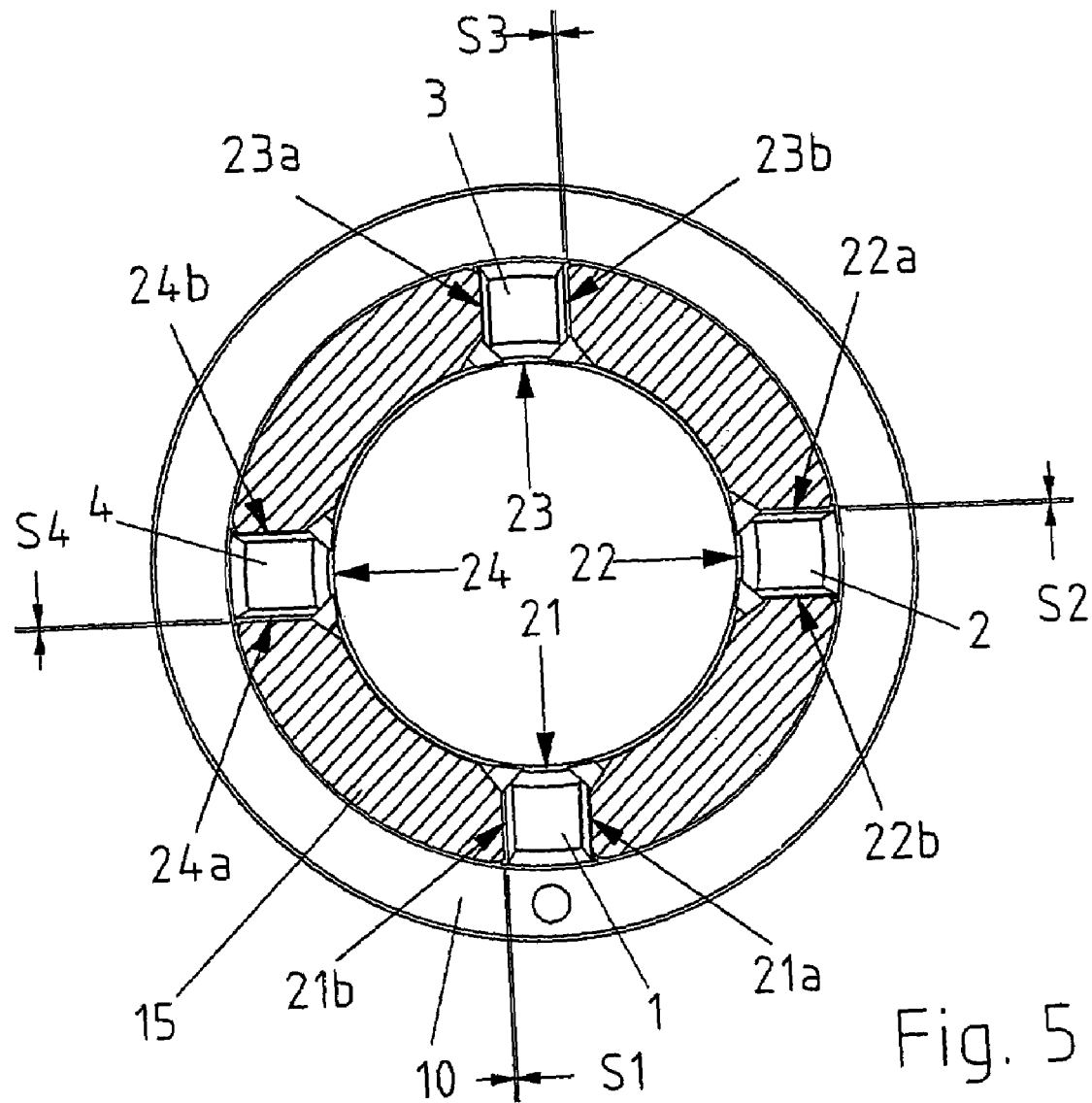
FIG. 5 shows a cross sectional view of the two coupling elements in a clamped state, taken along line B-B in FIG. 3.

FIG. 5 shows a sectional view of the two coupling elements 10, 15 in a clamped state, taken along line B-B in FIG. 3. For the sake of clarity, the mounting bores 12 of the first coupling element 10 are omitted in FIG. 5.

In the following explanations, adjacent grooves and adjacent centering pins, respectively, are addressed. Thereby, it is understood that the expression "adjacent" shall mean that adjacent grooves and adjacent centering pins, respectively, are grooves and centering pins, respectively, that are in consecutive locations as seen in circumferential direction of the coupling elements. In the case of four grooves and four centering pins, respectively, this means that not adjacent grooves and centering pins, respectively, are located diametrically opposite to each other.

Out of the four centering pins 1, 2, 3, 4 of the first coupling element 10, the right flank of the first centering pin 1, i.e. the one closest to the lower edge of the drawing, rests on the flank 21a of the first groove 21. Between the left flank of the first centering pin 1 and the left flank 21b of the first groove 21, a gap S1 remains. The adjacent second centering pin 2, as seen in counterclockwise direction, rests on the flank 22b of the second groove 22 on that side that is facing the adjacent first groove 21, while a gap S2 remains between the second centering pin 2 and the associated groove flank 22a of the groove 22 on that side that is remote from the first groove 21. The next adjacent centering pin 3, as seen in counterclockwise direction, does not rest on the flank 23b of the groove 23 on that side that is facing the adjacent second groove 22, with a resulting gap S3, but it rests on the associated groove flank 23a of the groove 23 on that side that is remote from the second groove 22. Finally, the next adjacent fourth centering pin 4, as seen in counterclockwise direction, rests on the flank 24b of the fourth groove 24 on that side that is facing the adjacent third groove 23, while a gap S4 remains between the forth centering pin 4 and the associated groove flank 24a of the groove 24 on that side that is remote from the third groove 23.

Out of the overall eight flanks 21a, 21b; 22a, 22b; 23a, 23b; 24a, 24b being inherent portions of the four grooves 21, 22, 23 and 24, the centering pins 1, 2, 3 and 4 rest in each case on two pairs of diametrically opposite flanks 21a, 23a, 22b and 24b, while the centering pins 1, 2, 3 and 4 do not rest on the two remaining pairs of diametrically opposite flanks 21b, 23b, 22a and 24a.

In any case, in order to determine the exact angular position of the one coupling element with regard to the other one, it must be ensured that each centering pin rests on one flank of its associated groove, whereby at least one of the centering pins has to rest on a flank of its associated groove that is opposite to the flanks of the grooves on which the remaining centering pins are resting, as seen in circumferential direction. In other words, and just as an example, in the case of four centering pins, three centering pins can rest on the leading flank of its associated groove, as seen for example in clockwise direction, while the fourth centering pin has to rest on the trailing flank of its associated groove. Or, as in the example described herein before, with four centering pins, two centering pins rest on the leading flank of its associated groove, while the remaining two centering pins rest on the trailing flank of its associated groove.

Due to the facts that each centering pins rests on its associated groove flank, that a high clamping force is exerted, and that Z reference stop surfaces having a large area are provided, the clamping apparatus of the invention is very rigid and can absorb high forces in X-, Y- and Z-directions. Since each centering pin rests only on one of the groove flanks, the clamping apparatus is relatively insensitive to contamination.

It is understood that it is also possible to modify existing clamping apparatuses according to the invention, i.e. clamping apparatuses in which the centering pins rest on both groove flanks. The only action to implement is to remove some material on one side of the centering pin and/or on one of the groove flanks, as has been previously been described.

What is claimed is:

1. A clamping apparatus comprising:
a first coupling element having a central axis and provided with at least three centering pins having at least partially conical shape;
a second coupling element having a central axis and adapted to be releasably attached to said first coupling element and provided with a number of grooves having two flanks opposite to each other and corresponding to the number of said centering pins provided on said first coupling element such that said centering pins provided on said first coupling element engage said grooves when said second coupling element is attached to said first coupling element;
said first and said second coupling elements both being provided with Z reference stop surfaces adapted to cooperate such as to determine the position of said second coupling element with regard to said first coupling element in Z-direction when said second coupling element is attached to said first coupling element;
the arrangement of said centering pins on said first coupling element being such that each centering pin rests only on one of said two flanks of the associated groove, whereby a gap remains between said centering pin and the opposite flank of said associated groove once said second coupling element is attached to said first coupling element;
whereby at least in a first groove the centering pin rests on that flank that faces a second groove adjacent to said first groove, while in said adjacent second groove the centering pin rests on that flank that faces said adjacent first groove such that the position of said second coupling element with regard to said first coupling element is defined in X- and Y-direction as well as with regard to the angular position of said second coupling element relative to said first coupling element.

2. A clamping apparatus comprising:
a first coupling element having a central axis and provided with at least three centering pins having at least partially conical shape;
a second coupling element having a central axis and adapted to be releasably attached to said first coupling element and provided with a number of grooves having two flanks opposite to each other and corresponding to the number of said centering pins provided on said first coupling element such that said centering pins provided on said first coupling element engage said grooves when said second coupling element is attached to said first coupling element;
said first and said second coupling elements both being provided with Z reference stop surfaces adapted to cooperate such as to determine the position of said second coupling element with regard to said first coupling element in Z-direction when said second coupling element is attached to said first coupling element;
the arrangement of said centering pins on said first coupling element being such that each centering pin rests only on one of said two flanks of the associated groove, whereby a gap remains between said centering pin and the opposite flank of said associated groove once said second coupling element is attached to said first coupling element;
whereby at least in a first groove the centering pin rests on that flank that is remote from a second groove adjacent to said first groove, while in said adjacent second groove the centering pin rests on that flank that is remote from said adjacent first groove such that the position of said second coupling element with regard to said first coupling element is defined in X- and Y-direction as well as with regard to the angular position of said second coupling element relative to said first coupling element.

3. A clamping apparatus according to claim 2 in which said centering pins provided on said first coupling element have a width that is smaller than the width of said grooves provided on said second coupling element.

4. A clamping apparatus according to claim 2 in which said first coupling element is provided with four centering pins essentially evenly distributed around said central axis, and in which said second coupling element is provided with four grooves essentially evenly distributed around said central axis.

5. A clamping apparatus according to claim 2 in which said centering pins rest on the associated groove flanks in a line contact once the first and second coupling elements are coalesced, but not yet clamped.

6. A clamping apparatus according to claim 2 in which said centering pins rest on the associated groove flanks in an area contact once the first and second coupling elements are clamped to each other.

7. A clamping apparatus according to claim 2 in which said first and second coupling elements are matched with regard to each other such that a gap exists between said Z reference stop surfaces as long as the first and second coupling elements are coalesced, but not yet clamped, whereby said gap is reduced to zero once the second coupling element is clamped to the first coupling element, utilizing the material elasticity between said centering pins and said groove flanks, such that the Z reference stop surface of said first coupling element rest on the Z reference stop surface of said second coupling element in the clamped state of the clamping apparatus.

8. A clamping apparatus according to claim 2 in which said centering pins are of symmetrical configuration, while said grooves have an asymmetrical shape.

9. A clamping apparatus according to claim 2 in which said Z reference stop surfaces essentially extend between said centering pins and said grooves, respectively, of the first and second coupling elements, respectively.

10. A clamping apparatus according to claim 2 in which said Z reference stop surfaces essentially have the shape of a segment of an annulus.

11. A clamping apparatus according to claim 1 in which said centering pins provided on said first coupling element have a width that is smaller than the width of said grooves provided on said second coupling element.

12. A clamping apparatus according to claim 1 in which said first coupling element is provided with four centering pins essentially evenly distributed around said central axis, and in which said second coupling element is provided with four grooves essentially evenly distributed around said central axis.

13. A clamping apparatus according to claim 12 in which centering pins located opposite to each other rest on those flanks of the associated grooves which are diametrically opposite to each other.

14. A clamping apparatus according to claim 1 in which said centering pins rest on the associated groove flanks in a line contact once the first and second coupling elements are coalesced, but not yet clamped.

15. A clamping apparatus according to claim 14 in which said centering pins comprise at least one conically shaped lateral surface adapted to rest on one of the flanks of the associated groove, whereby the angle of said at least one conically shaped lateral surface adapted to rest on one of the flanks of the associated groove differs by 0.2° to 2° from the angle of said flank, such that the front end of the centering pin rests on said flank along a line once the first and second coupling elements are coalesced, but not yet clamped.

16. A clamping apparatus according to claim 1 in which said centering pins rest on the associated groove flanks in an area contact once the first and second coupling elements are clamped to each other.

17. A clamping apparatus according to claim 1 in which said first and second coupling elements are matched with regard to each other such that a gap exists between said Z reference stop surfaces as long as the first and second coupling elements are coalesced, but not yet clamped, whereby said gap is reduced to zero once the second coupling element is clamped to the first coupling element, utilizing the material elasticity between said centering pins and said groove flanks, such that the Z reference stop surface of said first coupling element rest on the Z reference stop surface of said second coupling element in the clamped state of the clamping apparatus.

18. A clamping apparatus according to claim 1 in which said centering pins are of symmetrical configuration, while said grooves have an asymmetrical shape.

19. A clamping apparatus according to claim 1 in which said Z reference stop surfaces essentially extend between said centering pins and said grooves, respectively, of the first and second coupling elements, respectively.

20. A clamping apparatus according to claim 1 in which said Z reference stop surfaces essentially have the shape of a segment of an annulus.

* * * * *